United States Patent [19]

Gray et al.

[11] 4,238,763

[45] Dec. 9, 1980

[54] SOLID STATE MICROWAVE DEVICES WITH SMALL ACTIVE CONTACT AND LARGE PASSIVE CONTACT

[75] Inventors: Kenneth W. Gray; Leonard D. Irving, both of Malvern, England

[73] Assignee: National Research Development Corporation, London, England

[21] Appl. No.: 924,588

[22] Filed: Jul. 14, 1978

[30] Foreign Application Priority Data

Aug. 10, 1977 [GB] United Kingdom ............... 33609/77

[51] Int. Cl.³ ..................... H01L 29/44; H01L 29/48; H01L 47/02
[52] U.S. Cl. ........................................ 357/68; 357/3; 357/15; 357/55
[58] Field of Search ................... 357/3, 15, 68, 69, 55

[56] References Cited

U.S. PATENT DOCUMENTS

| | | | |
|---|---|---|---|
| 3,443,169 | 5/1969 | Foxell | 357/3 |
| 3,566,214 | 2/1971 | Usuda | 357/69 |
| 3,755,752 | 8/1973 | Kim | 357/3 |
| 3,808,470 | 4/1974 | Kniepkamp | 357/69 |
| 3,836,988 | 9/1974 | Board | 357/3 |
| 4,097,890 | 6/1978 | Morris et al. | 357/55 |

*Primary Examiner*—William D. Larkins

*Attorney, Agent, or Firm*—Pollock, VandeSande and Priddy

[57] ABSTRACT

This disclosure relates to two-terminal solid state microwave devices, such as transferred electron and avalanche effect devices, comprising a high-conductivity semiconductor substrate formed over at least a part of one major surface with an active layer of semiconductor material, a first contact providing electrical contact with the active layer to define the active region of the device, and a second contact on the same side of the substrate, providing a relatively low impedance contact to the substrate in operation of the device at the operating bias current for the active region.

To simplify fabrication, both contacts may have substantially identical structures with the second contact also overlying the active layer. In the case of transferred electron devices, the area of the second contact is then made greater than the first so that it is biased below threshold at the operating bias current for the active region; while in the case of avalanche effect devices having rectifying semiconductor junction contacts, only the first contact is reverse biased in operation, the second contact being forward biased to behave as a low resistance contact to the substrate. Methods of fabricating such devices are also disclosed.

9 Claims, 19 Drawing Figures

SOLID STATE MICROWAVE DEVICES WITH SMALL ACTIVE CONTACT AND LARGE PASSIVE CONTACT

This invention relates to solid state microwave devices, in particular to two-terminal microwave devices of the kind comprising a high-conductivity semiconductor substrate, a thin active layer of semiconductor material overlying at least part of one major surface of the substrate, first contact means providing electrical contact to an area of the active layer to define the active region of the device, and second contact means providing a relatively low-impedance electrical contact to the substrate in operation of the device at the operating bias current for the first contact means. Such devices will hereinafter be referred to as microwave devices of the kind specified.

Two of the most common types of microwave device of the kind specified for generating microwave power are the transferred electron device (Gunn diode) and the avalanche effect device (IMPATT, TRAPATT). The transferred electron device is a bulk effect, negative resistance device in which the mechanism giving rise to the negative resistance effect is a basic property of the semiconductor material used in the active region of the device, the most common material being n-type gallium arsenide. The avalanche effect device differs in that the mechanism giving rise to the negative resistance effect is a property of a semiconductor rectifying junction, either a p-n junction or a metal-semiconductor (Schottky) junction, and an active region of the device known as the transit region. Many semiconductor materials can be used in this active region, the most common of which are silicon and gallium arsenide.

Such devices are normally fabricated using integrated circuit techniques in which a large number of individual device chips is produced from a single substrate slice on which the thin active layer of semiconductor material is formed. At present, the only satisfactory known way of forming this active semiconductor layer is by epitaxial growth.

A widely used fabrication technique is then to define on the epitaxial surface a contact pattern, usually comprising an isolated metallized contact area for each device, providing the first contact means. The unmetallized areas of the active layer between the contacts are then etched away to the substrate to leave an array of isolated mesas raised above the surface of the substrate. The substrate slice is then inverted and a contact metallization applied to the lower surface of the substrate to provide the low-impedance second contact means. The slice is then scribed and cleaved to yield a large number of individual devices which are then normally mounted in metal-ceramic encapsulations for robustness and ease of handling. This individual encapsulation procedure is relatively expensive and the encapsulated device is not compatible with integrated circuits. Alternatively, the unencapsulated devices can be mounted directly into a microstrip or stripline integrated circuit, one contact surface, say the contact to the active region, is bonded to the ground plane of the circuit and gold wires or tapes bonded between the other contact surface and the microstrip or stripline conductor. Again this procedure can be expensive as it requires a wire bonding operation.

Alternative widely used techniques exist which fabricate beam lead devices in which the leads are made from metal electroplated-up on the semiconductor material. This technique uses many photolithographic steps and is therefore relatively complex and expensive.

It is an object of the present invention to provide solid state microwave devices of the kind specified in which at least some of the above-mentioned disadvantages are overcome or at least substantially reduced.

According to one aspect of the present invention, in a microwave device of the kind specified both the first and the second contact means are provided on the same side of the substrate. This enables the device to be simply fabricated and also to be face-bonded directly onto an integrated circuit in a single bonding operation.

In the case of transferred electron devices, the active layer is of a semiconductor material exhibiting bulk negative resistance properties, eg GaAs, InP, CdTe and ZnSe, the first contact means then comprising an area of metallized contact material forming an ohmic contact with the active layer. Where an ohmic contact of high quality is required, this contact may be made through a thin high-conductivity semiconductor layer, formed for example by doping the surface of the active layer.

In such devices the electronic structure of the second contact may conveniently be identical with that of the first contact means, comprising an area of metallized contact material forming a low resistance contact with the active layer, but having an area of contact substantially greater than that of the first contact so as to effectively provide a relatively low impedance contact to the substrate.

In this way, upon application of a suitable bias potential across the device, the second contact means will operate below threshold as a low-impedance contact to the substrate at the operating bias current for the first contact means. Preferably the area of contact of the second contact means with the active layer is at least five times greater than that of the first contact means.

In the case of avalanche effect devices in accordance with the invention, the first contact means is formed as a rectifying semiconductor junction contact with the active layer, comprising an area of metallized contact material either forming a Schottky barrier contact with the active layer or in contact with a semiconductor surface layer of opposite conductivity-type to the active layer, forming a rectifying p-n junction with the active layer. Preferred active semiconductor materials for these types of active layer device include Si, Ge and GaAs.

Again the electronic structure of the second contact means may conveniently be substantially identical to that of the first contact means, comprising an area of metallized contact material forming a rectifying Schottky barrier or p-n junction contact with the active layer such that in use, upon application of a suitable bias potential between the two contact means to produce a reverse bias across the first contact means, a forward bias is produced across the second contact means which thus behaves substantially as a low resistance contact to the substrate at the operating bias current of the first contact means. Again, the area of contact of the second contact means may be substantially greater than that of the first contact means to further reduce its impedance.

The fabrication of devices in which the electronic structures of the first and second contact means are substantially identical is considerably simplified since both contact means can be made during the same fabrication stages, resulting in co-planar contact areas.

Where the contact material of the second contact means overlies the active layer, the two contact means may be formed as mesa structures raised above the surface of the substrate for isolation purposes. In such a case, one or both contact means may be defined by more than one metallized contact area, each capping a respective mesa structure thereby improving mechanical stability. In a preferred structure, the first contact means comprises two spaced circular areas of metallized contact material thereby producing a stable three-legged structure. Division of the first contact means in this way also aids heat-sinking. Alternatively the contact areas may be suitably shaped to improve mechanical stability.

The area of electrical contact between the first contact means and the active semiconductor layer may be defined by a hole or holes formed in a layer of insulating material. This is particularly suitable for devices such as mixers or detectors in which the area of the active region must be very small. Contact material formed around the hole or holes on the insulating material may be used to provide a large area bonding surface.

The second contact means need not have the same electronic structure as the first contact means. Instead it may comprise an area of metallized contact material formed in direct contact with the substrate to provide the necessary low impedance. Where this is the case, the metallized contact material preferably makes contact with the substrate through a hole in the layer of semiconductor material. Contact material formed around the hole on the upper surface of the device may then provide a bonding surface and the overall area of the second contact means need be no larger than that of the first contact means.

Devices in accordance with the invention may be fabricated using well established techniques and materials used in the fabrication of these types of device in conventional configuration. All operations are carried out on one side of the substrate, and, for some types of device, no additional operations are required to produce the second contact means.

Thus, according to a second aspect of the present invention, a method fabricating a solid state microwave devices of the kind in accordance with the first aspect of the invention includes the steps of forming a thin active layer of semiconductor material over at least a part of one major surface of a high conductivity semiconductor substrate, and defining said first and second contact means by forming on the same side of the substrate at least one separate area of metallized contact material for each contact means, the area or areas of metallized contact material for at least the first contact means being formed over the surface of the active layer.

Where the areas of metallized contact material for both the first and second contact means are formed over the surface of the active layer, they are preferably defined from a common layer of metallized contact material by forming a mask bearing the desired contact pattern over the metallization layer and then removing portions of the metallization layer.

Prior to removal of the mask, portions of material underlying the removed portions of the metallized layer may conveniently be removed down to the substrate using the same mask, to leave an isolated mesa structure on the surface of the substrate under each area of metallized contact material.

To aid bonding, the thickness of the metallized contacts may be increased by depositing additional metal onto the metallized contact areas through a mask. Alternatively the metallized contact areas may be more simply defined by applying a layer of metallized contact material over the surface of the active layer, defining a mask on the surface of the metallization layer having holes through which areas of the metallization layer corresponding to the desired contact pattern are exposed, electroplating a thick layer of contact metal onto these exposed areas, removing the mask, and removing exposed areas of the original metallization layer using the thick electroplated contact metal as a mask. Conveniently, following removal of said exposed areas of the metallization layer, portions of material underlying these areas are removed by etching down to the substrate, again using the thick electroplated contact metal as a mask, to leave an isolated mesa structure under each metallized contact area.

Similar methods may be used to fabricate devices in accordance with the invention in which the area of metallized contact material for the second contact means is formed in direct contact with the substrate, for example by defining this area of metallized contact material from a region of the metallization layer overlying an area of the substrate not covered by the active layer. However, this would result in a structure in which the bonding areas of the two contact means are not co-planar, leading to bonding difficulties. This difficulty may be overcome by forming a hole in the active layer through which the area of metallized contact material for the second contact means makes contact with the substrate, with parts of this metallized contact area overlying the surface of the active layer around the hole to provide a bonding surface.

The area of contact between the metallized contact area or areas for the first contact means may be defined by a hole or holes in a layer of insulating material, eg an oxide layer, formed over the active layer prior to application of the metallization layer over this insulating layer. In such cases a hole may also be made in the insulating layer for the second contact means. The contact metallization is defined as above, eg by etching using a mask, into a suitable pattern for bonding. This technique is particularly suitable for devices such as mixers or detectors in which the area of the active region must be very small as discussed earlier. Parts of the area or areas of contact material for the first contact means surrounding the hole or holes may be used to provide a large area bonding surface, the metallized contact area for the second contact means preferably being confined within the associated hole in the insulating material. Again mesa structures may be formed by removal down to the substrate of regions of material not covered by the metallized contact pattern.

The invention will now be further described by way of example only, with reference to the accompanying drawings, of which:

FIGS. 1(a) to (d) illustrate stages in the fabrication of one form of solid state microwave device in accordance with the invention, and FIG. 1(e) illustrates how the device may be inserted into an integrated circuit;

Figure 5:
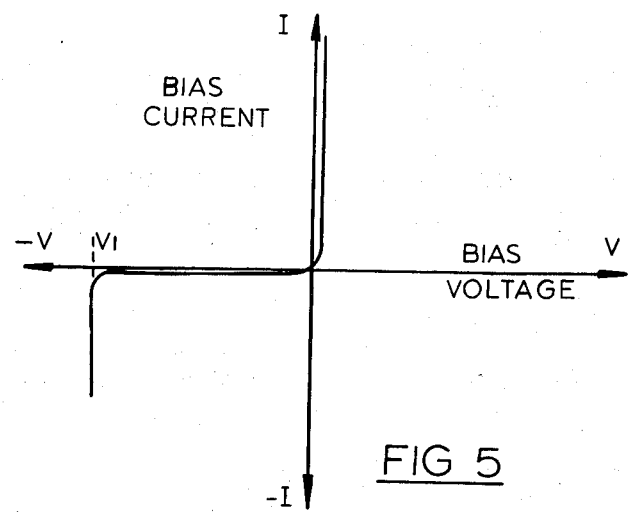

FIG. 4(a) to (d) illustrate stages in the fabrication of another form of device in accordance with the invention;

FIG. 5 shows a characteristic of another form of device in accordance with the invention; and FIGS. 6(a) to (d) illustrate stages in the fabrication of another form of device in accordance with the invention.

Figure 1:
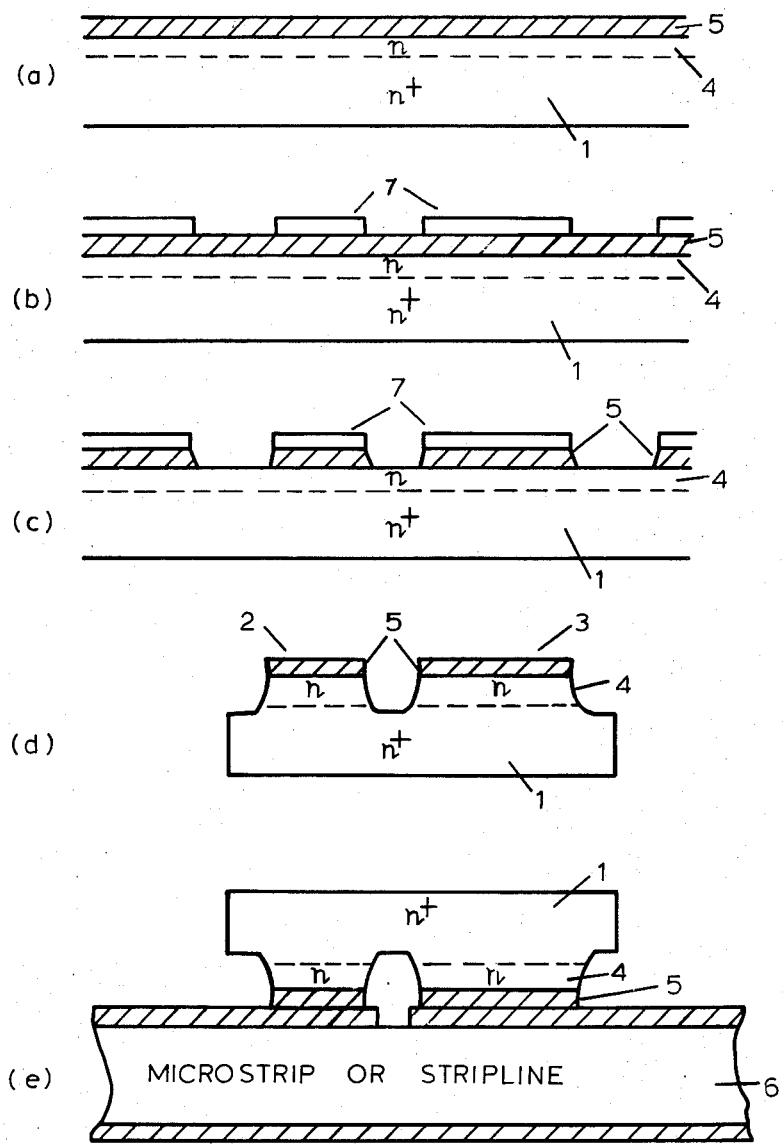

Referring to the drawings, FIGS. 1(a) to (d) illustrate stages in the fabrication of a transferred electron device or Gunn diode in accordance with the invention. A completed device chip is shown in FIG. 1(d) and comprises a high-conductivity GaAs substrate 1 formed with two mesa structures 2, 3 each comprising a thin (approx 10 μm) epitaxial layer 4 of high-purity n-type GaAs sandwiched between a layer of metallized contact material 5 and the substrate, providing an ohmic contact to the epitaxial layer 4. Optionally these contacts may be made through a thin high conductivity n+ region (not shown) formed by doping the surface of the epitaxial layer 4 in known manner.

Figure 2:
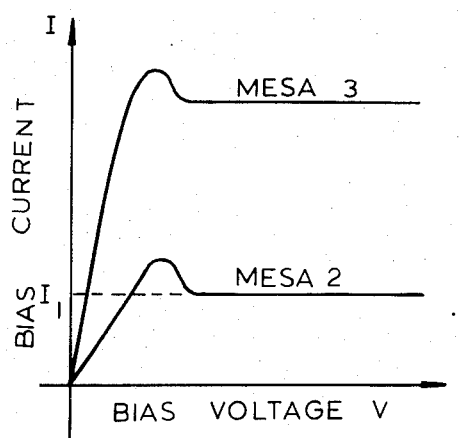
FIG. 2 shows an I/V characteristic of the device of FIG. 1.

The two areas of contact material 5 formed on the upper surfaces of the mesas 2,3 provide the two contacts for the device. It will be seen that one of the mesas 3 is larger than the other 2, and so there will be a far smaller voltage drop across the semiconductor region of this mesa than across that of the smaller mesa 2 when a bias voltage is applied between the two contacts. The I/V characteristics of these two potential active semiconductor regions are shown in FIG. 2, from which it will be seen that at the operating bias current $I_1$ for the smaller active region of mesa 2, the characteristic of the other mesa 3 is substantially linear and well below threshold. Thus the larger area mesa 3 will behave as a low-impedance contact, the larger its area, the lower its impedance, and area differences of the order of five times or more have been found satisfactory.

The devices can be fabricated using well known integrated circuit techniques applied to the mass fabrication of conventional Gunn diodes in mesa configuration as exemplified by the technique illustrated in FIGS. 1(a) to (d). The thin n-type semiconductor epitaxial layer 4 is formed on the surface of a wafer of high-conductivity n-type GaAs substrate slice 1 and the optional thin high-conductivity surface layer (not shown) then formed at this stage if required, by doping the surface of the epitaxial layer 4. Metallized contact material 5 is then deposited over the whole epitaxial surface to provide a good low-impedance ohmic contact therewith (FIG. 1(a)). A photo-resist mask 7 corresponding to the desired pattern of metallization is then applied to the surface of the metallization layer 5 (FIG. 1(b)), and the exposed areas of the metallization layer then etched away using a suitable etchant (FIG. 1(c)). As described above, the desired metallization pattern will differ from that used in the manufacture of conventional devices of this kind because each device will require two contact areas, one considerably larger than the other, although the electronic structure of each will be substantially identical.

Following removal of the exposed areas of metallization 5, the thus-exposed GaAs surrounding the remaining contact metallization is then etched away to a depth greater than the thickness of the epitaxial layer 4 and the photoresist pattern 7 removed leaving an array of mesas 2,3 raised above the surface of the substrate 1. The wafer is then scribed and cleaved to produce a plurality of GaAs chips each comprising a separate device having one large mesa 3 and one small mesa 2 on its upper surface (FIG. 1(d)).

The finished devices require no separate packaging and can be bonded directly into a microstrip or stripline integrated circuit 6 (FIG. 1(e)), using thermo-compression or ultrasonic bonding techniques giving good heat-sinking qualities. If desired the thickness of the metal contacts 5 can be increased by electroplating, involving one extra photolith step. This aids bonding, improves reliability, and enables the use of eutectic or epoxy bonding techniques. Bonding is also facilitated by the coplanar relationship of the bonding surfaces of the devices.

Figure 3:
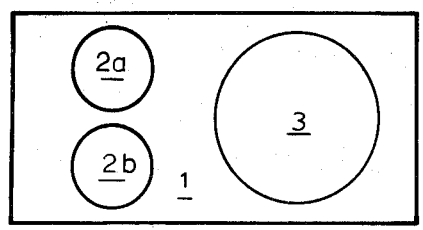
FIG. 3 shows a modified form of the device of FIG. 1.

To improve mechanical stability during bonding, the shapes of the mesas 2,3 may be varied, or one or both may be replaced by two or more smaller mesas of the same total area. As shown in FIG. 3, the active mesa 2 is replaced by two smaller mesas 2a, 2b to provide a three-legged structure. The splitting of the active mesa in this way has the additional advantage of improving heat-sinking properties.

Figure 4:
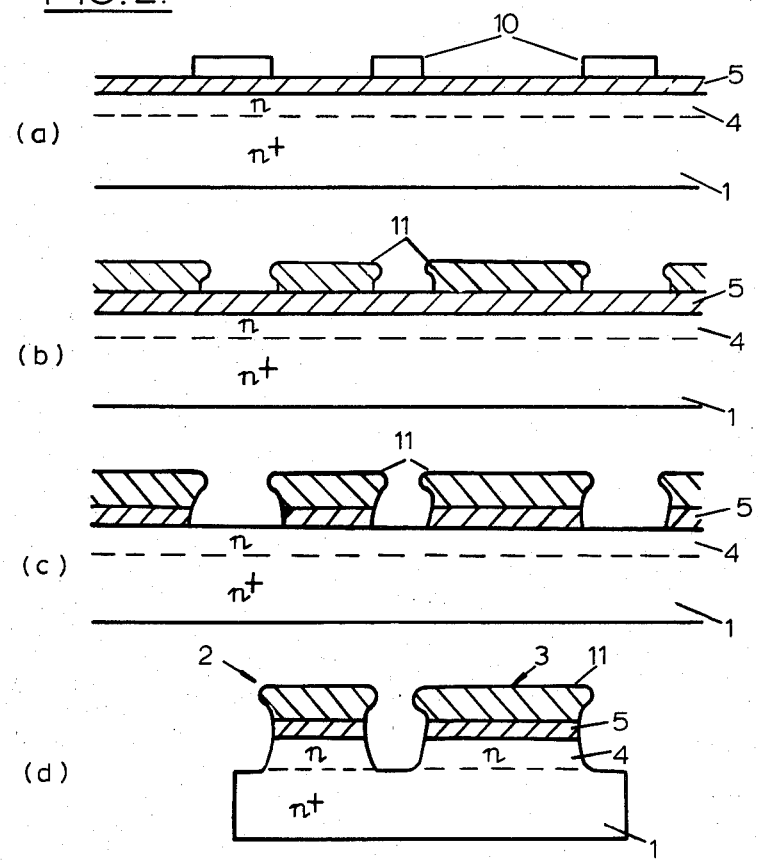

An alternative fabrication technique is illustrated in FIGS. 4(a) to (d), in which following the deposition of the metallization layer 5, a photoresist mask 10 is formed having holes corresponding to the desired metallization pattern as shown in FIG. 4(a). Thick metal contact pads 11 of, for example, gold or silver are then electroplated onto the areas of the metallization layer 5 exposed through the holes in the photoresist mask 10 which is then removed (FIG. 4(b)). Exposed areas of the metallization layer 5 are then etched away using the metal pads 11 as a mask (FIG. 4(c)), and mesas then formed by etching away exposed areas of GaAs to a depth greater than the epitaxial layer 4 using the thick metal contact pads 11 as a mask. A completed device is shown in FIG. 4(d). The extra thickness of the metal contact pads 11, as before, enables eutectic or epoxy bonding technics to be used, and is produced by a simpler method requiring only one photolith step.

The devices may be fabricated from any other suitable material conventionally used in the manufacture of transferred electron devices, eg InP, CdTe or ZnSe, and using any other suitable integrated circuit techniques.

The above device configurations and fabrication methods may equally be applied to avalanche effect devices such as IMPATTs and TRAPATTs in which the negative resistance effect is produced either by a reverse-biased p-n junction or a reverse-biased Schottky barrier. The configuration of an avalanche effect device is similar to a transferred electron device except that in the p-n junction avalanche device the active region of the semiconductor layer is formed with an opposite conductivity-type diffusion to produce the required p-n junction, while the Schottky barrier avalanche device the contact metallization of the first contact means must be such as to produce a Schottky barrier with the semiconductor layer.

Although the configuration of avalanche effect and transferred electron effect devices manufactured by the above fabrication techniques is substantially the same, the theory of operation is different. FIG. 5 shows a typical I/V characteristic of a p-n junction or Schottky barrier diode. The avalanche breakdown giving rise to the negative resistance effect only occurs when a suitable reverse bias $V_1$ is applied across the diode. In devices of the above described type having two mesas, and hence two rectifying junctions, if a bias potential is applied across the two terminals of the device, one of the junctions will be reverse-biased providing the active region of the device, while the other junction will be forward-biased to behave as a low resistance contact with the substrate 1. The larger the area of the forward-biased junction the lower its impedance and the higher the device dc-to-microwave conversion efficiency.

Avalanche effect devices in accordance with the invention may similarly be fabricated using materials conventionally used in such devices, the most common of which include GaAs, Si and Ge, and the substrate may be of either conductivity type.

The device shown in FIG. 6(d) is a further form of solid state microwave device in accordance with the invention designed for operation as a mixer or detector. Again the device comprises a high-conductivity n-type GaAs substrate 15 on which are formed two mesa structures 16,17 each comprising a thin high-purity epitaxial semiconductor layer 18 sandwiched between respective areas 20,21 of contact material and the substrate 15. The contact material 20 on mesa 16 makes contact with the epitaxial layer 18 through a small hole 19 is an intermediate insulating layer 23, eg of native or deposited oxide, while the contact material 21 makes direct contact with the substrate 15 through a hole 24 in the epitaxial layer of mesa 17.

The active region of the device defined by the size of the hole 19 in the insulating layer 23 may either comprise a Schottky contact or p-n junction which may be formed as described above in connection with the avalanche device fabrication. This technique enables very small active areas required for mixer or detector operation to be achieved. In addition, direct contact of the contact material 21 with the highly doped substrate through the hole in the epitaxial layer of mesa 17 enables the necessary low-impedance DC contact (in this case a low resistance tunnelling contact) to be achieved while retaining the advantages of large, and hence mechanically stable, substantially co-planar contact areas for bonding purposes.

FIGS. 6(a) to (d) illustrate different stages in a typical fabrication procedure starting with a high-conductivity n-type GaAs substrate slice 15 formed with epitaxial layer 18 and a coating of insulating oxide 23. Pairs of holes 19,26 are opened up in the oxide coating 23 using a photolith mask, hole 19 corresponding in size to the required active area, and hole 26 corresponding in diameter to that required for the mesa 17, as shown in FIG. 6(a). A second photolith mask 28 is then applied in the pattern indicated in FIG. 6(b), and the exposed areas of GaAs etched down to the substrate 15 to leave holes 24. This mask 28 is then removed and a common metallization 27 applied over the whole slice. A third photolith mask 25 (FIG. 6(c)) is then used to define the metallized contact areas 20,21 and, using the same mask, exposed areas of the oxide layer 23 are removed and mesas 16,17 defined by etching away exposed GaAs down to the substrate 15. The slice is then scribed and cleaved to yield a plurality of individual device chips of the kind shown in FIG. 6(d).

Similar fabrication techniques may be applied to transferred electron and avalanche devices of the kind described earlier and in which the area of the active region of the device can be determined by the area of contact between the metallization and the active epitaxial layer. This area can be defined by a hole in an insulating coating, and in this way, the area of the mesa containing the active region of the device can be made larger than the active area, for example, the same size as the mesa providing the low-impedance contact. Similarly the low-impedance contact may be made direct to the substrate through a hole in the epitaxial layer of the non-active mesa, this mesa then being used to provide a large metallized bonding area co-planar with the active mesa bonding area. However, these techniques add considerably to the number of process steps required and hence to the overall cost and production yield of each device.

Any of the devices described above may be further simplified for some applications. For example, it may in some cases be possible to eliminate the mesa etching step, the active area of the device being defined solely by a metallized area in contact with the epitaxial layer; and the low-impedance contact being defined either by a suitably large metallized area in contact with the epitaxial layer, or by a metallized area in direct contact with the substrate. Alternatively, the device may be formed with a single mesa incorporating the active region of the device and surrounded by exposed substrate on which the low impedance contact is directly formed. A disadvantage of this latter arrangement is that the bonding areas would not then be co-planar, leading to possible difficulties during bonding.

Figure 6:
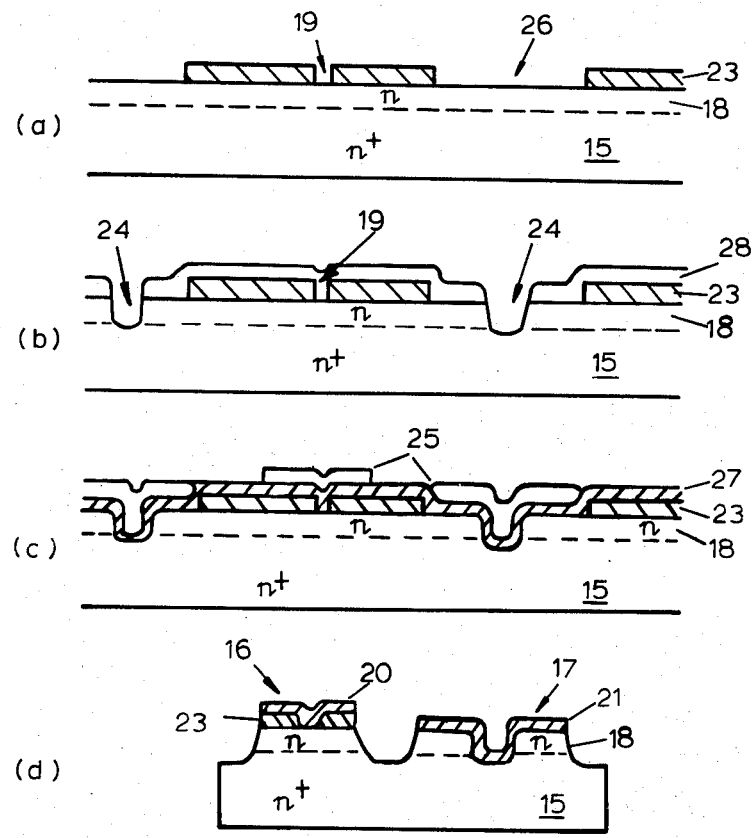

To overcome this problem, the area of metallized contact material for the second contact means may make contact with the substrate through a hole formed in the active layer, which is preferably in the form of a mesa, as in the FIG. 6 embodiment, although this may not be necessary. The metallized contact area surrounding the hole may then provide a bonding area coplanar with that of the first contact means; and because it makes contact directly with the substrate, may be of relatively small overall area, typically the same area as the first contact means.

We claim:

1. A solid state microwave device comprising a high-conductivity substrate, a thin active layer of semiconductor material overlying at least part of one major surface of the substrate, first metalized contact means overlying the active layer and providing electrical contact to an area of the active layer to define the active region of the device, and second metallized contact means also overlying the active layer and providing electrical contact with an area of the active layer, the electronic structures of the first and second contact means being substantially identical to one another, the area of the contact provided between the second contact means and the active layer being substantially greater than that provided between the first contact means and the active layer whereby, upon application of a suitable bias potential between said first and second contact means to induce microwave operation in the active region of the device underlying the first contact means, the region of the active layer underlying the second contact means remains inactive, and the second contact means behaves as a relatively low impedance contact to the high conductivity substrate underlying the active layer.

2. A solid state microwave device as claimed in claim 1, wherein the active layer comprises a semiconductor material exhibiting bulk negative resistance properties, the first and second contact means each comprising an area of metalized contact material forming an ohmic contact with the active layer, the difference in area between the two contact means being such that, on application of a suitable bias potential between the first and second contact means, the second contact means is biased below threshold at the operating bias current for the first contact means.

3. A solid state microwave device as claimed in claim 1 wherein the first and second contact means each form a rectifying Schottky barrier or p-n junction contact with the active layer, such that in use, upon application of a suitable bias potential between the first and second contact means to produce a reverse bias across the first contact means the second contact means is forward biased and behaves substantially as a low resistance contact with the substrate.

4. A solid state microwave device as claimed in one of claims 1 to 3 wherein the area of contact between the second contact means and the active layer is at least five times greater than that between the first contact means and the active layer.

5. A solid state microwave device as claimed in one of claims 1 to 3 wherein each of the metalized contact areas comprises an area of metalized contact material overlying the top surface of a separate mesa of active layer material raised above the surface of the substrate.

6. A solid state microwave device as claimed in claim 5 wherein the first contact means comprises at least two separate areas of metalized contact material each overlying the top surface of a separate mesa of active layer material raised above the surface of the substrate.

7. A solid state microwave device as claimed in one of claims 1 to 3 wherein the area of contact between the first contact means and the active layer is defined by a hole formed in a layer of insulating material overlying the active layer through which contact is made.

8. A solid state microwave device as claimed in one of claims 1 to 3 wherein the high conductivity substrate comprises a high conductivity semiconductor material of the same conductivity type as the active layer material which is epitaxially formed thereon.

9. A solid state microwave device as claimed in one of claims 1 to 3 wherein the first and second contact means are fabricated of the same material.

* * * * *